United States Patent [19]

Dadowski et al.

[11] 4,152,986

[45] May 8, 1979

[54] METHOD AND APPARATUS FOR PRINTING RAISED INK IMAGES

[76] Inventors: Gilbert F. Dadowski, 104 Lee Ridge Dr., Corapolis, Pa. 15108; Robert J. Mahr, 1207 Allire Ave., Monaca, Pa. 15061; Stanley P. Drachman, 1430 Beech St., Atlantic Beach, N.Y. 11509

[21] Appl. No.: 905,374

[22] Filed: May 12, 1978

Related U.S. Application Data

[63] Continuation of Ser. No. 747,242, Dec. 3, 1976, abandoned.

[51] Int. Cl.² ............... B41L 11/14; B41L 27/06; B41L 27/08; G03F 7/02
[52] U.S. Cl. .................. 101/463; 101/170; 101/350; 101/395; 101/401.1; 101/426; 101/216
[58] Field of Search ........... 101/395, 401.1, 463, 101/473, 363, 364, 350, 416 R, 170, 216, 131, 132; 96/35, 36, 38

[56] References Cited

U.S. PATENT DOCUMENTS

| | | | |
|---|---|---|---|
| 2,260,364 | 10/1941 | Case | 101/350 |
| 2,268,594 | 1/1942 | Huber | 101/416 R |
| 2,456,608 | 12/1948 | Alger | 101/399 |
| 3,098,437 | 7/1963 | Tyma, Jr. et al. | 101/350 |
| 3,285,169 | 11/1966 | Hartwig | 101/350 X |
| 3,587,463 | 6/1971 | Granger | 101/350 |
| 3,613,578 | 10/1971 | Heurich | 101/350 |
| 3,891,443 | 6/1975 | Halpern et al. | 96/79 |

Primary Examiner—J. Reed Fisher
Attorney, Agent, or Firm—Koenig, Senniger, Powers and Leavitt

[57] ABSTRACT

A method of printing a raised ink image on a substrate for use as a hectographic or spirit duplicating master or the like involving forming a printing plate having a raised image area thereon, the latter having a plurality of regularly spaced, screen-like depressions therein for increasing the amount of the ink carried by the raised image area. The plate is mounted on the plate roll of a rotary press and ink is applied to the plate. The plate and the sustrate are then brought into printing engagement with one another and a raised ink image is transferred to the substrate.

Apparatus for carrying out the above-described method and details of the printing plate are also disclosed.

11 Claims, 9 Drawing Figures

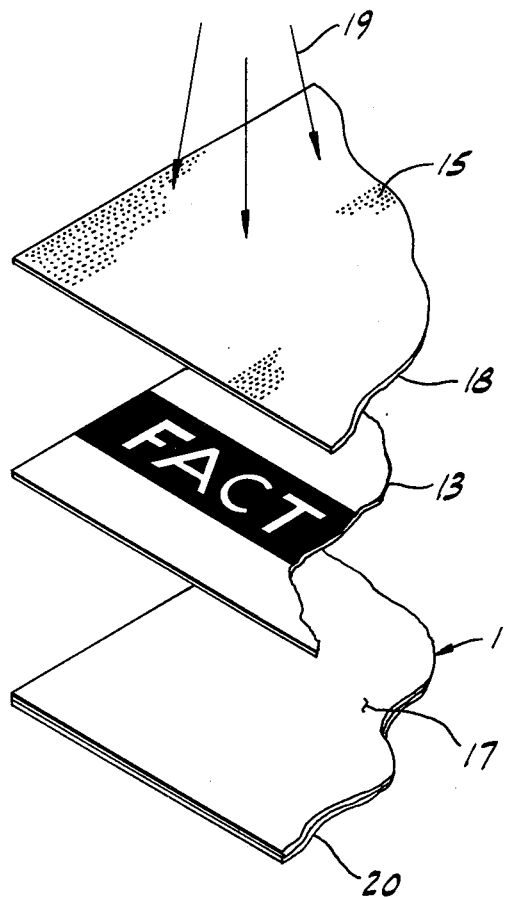
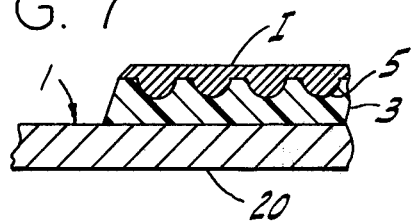
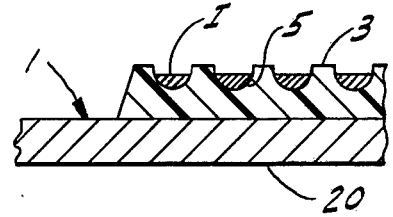
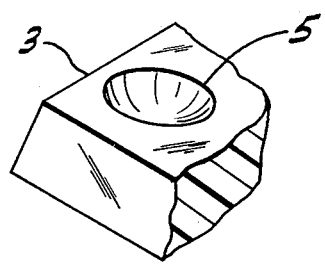
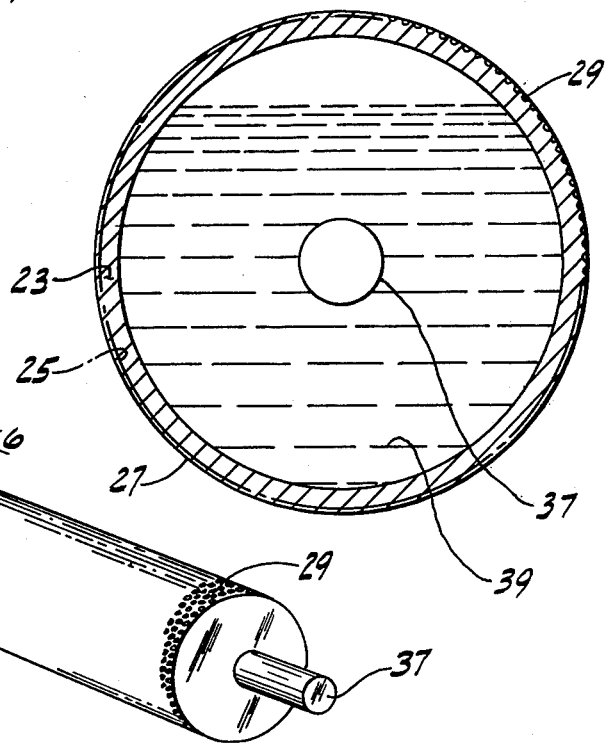
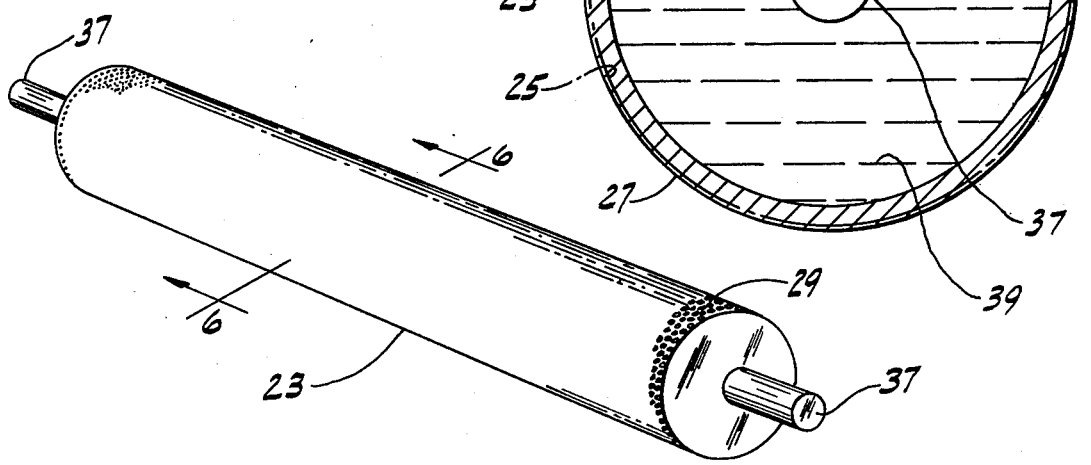

METHOD AND APPARATUS FOR PRINTING RAISED INK IMAGES

This is a continuation, of application Ser. No. 747,242, now abandoned, filed Dec. 3, 1976.

BACKGROUND OF THE INVENTION

This invention relates to a method of, apparatus and a printing plate for printing raised ink images, and even more specifically for direct printing raised ink hectographic or spirit duplicating masters.

Hectographic or spirit duplicating is a widely used process and is especially attractive because of its low per copy and equipment costs and because no special training is required to operate or service the equipment. Generally, a spirit duplicating master includes a substrate, usually paper, carrying a hectographic ink mirror image of the material to be duplicated. The hectographic ink on the master contains a spirit or alcohol soluble dye which when pressed into momentary printing contact with a sheet of paper which has been previously wetted with a spirit or alcohol solution transfers dye from the master to the sheet. It can thus be seen that some of the hectographic ink is used up from the master as each hectographic copy is printed and that in order for a hectographic master to have a relatively long copy run life and to print legible copies, it must have a relatively thick hectographic ink image thereon.

In many instances, it is desirable to print large numbers of identical pre-printed hectographic masters. Conventionally, hectographic masters are printed by either of four methods.

First and most commonly used is the so-called impact or crash printing method which uses a master set comprising a master substrate sheet and an ink sheet having a solid coating of hectographic ink thereon, the ink sheet being in face-to-face contact with the substrate. The master set is printed on a conventional letter press by passing the set between the nip of the plate cylinder having a raised letter plate thereon and the impression roll of the press so that the raised printing areas on the plate exert great pressure on the master set to thus forceably press the substrate into the ink sheet and to transfer ink to the substrate to form a mirror ink image on the substrate. Since the ink on the ink sheet is relatively thick, a heavy or raised ink image is formed on the substrate so that crash printed hectographic masters have a relatively long copy run life. While the crash printing method has the advantage that the ink sheet can be retained as a part of a master set so that a user can add other information to the master prior to duplicating, this crash printing method of making hectographic masters is expensive because an ink sheet must be provided for each master. Also, because the pressure required to transfer the hectographic ink from the ink sheet to the substrate must be transferred through the sheets of the master set, it is difficult to print masters having sharply defined characters or large solid areas to be printed.

The second method of printing hectographic masters utilizes a rotary letter press to direct print a mirror hectographic ink image on a master substrate. While this method eliminates the requirement of providing an ink sheet for each master and is thus of much lower cost, and while this method also provides a master with more sharply defined ink images, masters produced by this direct printing method have a relatively short copy run life and often do not print clear, legible copies. Letter press printing generally requires the use of a low viscosity ink. Usually, these low viscosity inks set by solvent evaporation and/or by absorption of the solvent into the copy paper. Also, letter press plates carry a relatively thin layer of ink on their printing surfaces. The solvent loss of the ink and the relatively thin layer of ink carried by the letter press printing plate together result in a relatively thin layer of ink remaining on the master substrate and that in turn results in a relatively low copy run life for masters printed by the direct print method.

The third known method of making identical hectographic masters is that of gravure direct printing utilizing engraved metal print rolls and a hectographic ink. The high cost of these engraved gravure print rolls or plates makes this method expensive for all but the longest printing runs of identical hectographic masters. This method requires a low viscosity hectographic ink which sets by solvent evaporation or absorption into the paper which in turn results in thin ink images. The thin ink images on the master in turn result in poor copy quality and short copy run life for the master.

The fourth known method of printing hectographic masters involves screen printing the ink image on a master substrate. While screen printing does result in hectographic masters having the good run life of crash printed masters and the image sharpness of direct printed masters, screen printing is slow, involves a good deal of skilled labor, and requires special equipment. Accordingly, screen printed hectographic masters are relatively expensive.

With regard to the known prior art, reference may be made to U.S. Pat. Nos. 2,456,608 and 3,891,443 which disclose printing plates having roughened ink areas. In the first-mentioned patent, type for making proofs which in turn are used to make gravure printing plates is disclosed in which metal type is cast having a criss-crossing series of elongate grooves formed therein which terminate short of the edges of the type character. These grooves prevent the ink therein from being drawn out or dislodged by the action of the doctor blade on the printing press when the proof characters are being printed by the type. In the second-mentioned patent, a photosensitive relief printing plate is disclosed in which the surface of the plate is roughened to increase its ink holding capability either by embossing the photosensitive material prior to exposing it by running the plate between a pair of roughened nip rolls thereby to emboss a mat finish on the plate or by providing a preroughened metal plate so that the photosensitive material conforms to the roughened surface of the plate.

SUMMARY OF THE INVENTION

Among the several objects of this invention may be noted the provision of a method of and apparatus for direct printing a raised ink image on a substrate, such as a hectographic master, which has sharply defined images, and is relatively inexpensive; the provision of such a method and apparatus in which the printing plates for printing raised ink image may be made from commercially available photosensitive printing plates without special equipment or developing solutions; the provision of such method and apparatus in which hectographic masters can be printed at relatively high production printing rates and in which the hectographic masters have a good copy run life and produce high quality hectographic copies; the provision of such method and apparatus in which conventional printing equipment may be readily adapted to print hectographic masters and may readily be converted from printing hectographic masters to conventional printing; the provision of a printing plate for use in the above-mentioned method and apparatus which can be used to print large numbers of raised ink hectographic masters or other raised ink images; and the provision of such method and apparatus which may directly print a hectographic ink reverse-reading image on one face of a substrate and which may also print a conventional ink direct-reading image on the other face of the substrate corresponding to and in registration with the mirror image.

Briefly, the method of this invention of printing a raised ink image on a substrate comprises mounting a raised image area printing plate on a support with the raised areas of the plate having a plurality of regularly spaced depressions therein for holding a supply of ink sufficient to print raised ink images on the substrate. A metered supply of ink is applied to the raised image areas of the plate so that the ink fills the depressions and covers the raised image areas. The substrate and the ink plate are then brought into printing engagement with one another for printing a raised ink image on the substrate.

The apparatus of this invention for printing a raised ink image on a substrate comprises a frame, a cylindric roll journaled on the frame for rotation about its axis and being adapted to support a printing plate for printing contact with said substrate. An ink reservoir is provided and it holds a supply of hot melt ink which when heated above a first temperature constituting its melting temperature is a liquid and when cooled below a second temperature constituting its freezing temperature is a solid. An ink roll is also provided for transferring ink from the reservoir and for applying ink to a printing plate supported on the cylindric roll. Means for bringing the substrate and the printing plate on the cylindric roll into printing contact with one another are provided thereby to transfer an ink image from the printing plate onto the substrate. The apparatus also includes means for heating the reservoir above the melting temperature of the ink and for maintaining the ink as a liquid as the ink is transferred from the reservoir to the substrate at which time it substantially instantaneously freezes thereby to form a raised ink image on the substrate.

A printing plate of this invention for printing raised ink images on a substrate comprises a metallic plate having an ink carrying surface thereon raised from said metallic plate at a distance of about 0.015 inches plus or minus 0.005 inches, this raised ink area having a plurality of substantially regularly spaced gravure depressions therein arranged in a screen-like array ranging between about 90 to 180 lines per inch.

Other objects and features of this invention will be in part apparent and in part pointed out hereinafter.

BRIEF DESCRIPTION OF THE DRAWINGS

FIG. 4 is an exploded diagramatic view depicting the method of this invention for forming a raised image area printing plate with the above-mentioned depressions in its raised image areas;

FIG. 5 is a perspective view of an ink transfer roll for use in apparatus of this invention having an improved ink carrying surface formed in accordance with the method of this invention;

FIG. 6 is an enlarged transverse cross-sectional view taken along line 6—6 of FIG. 5 of the ink transfer roll showing ink-carrying surface of the ink transfer roll, a heater within the roll, and a heat transfer medium within the roll for transferring heat from the heater to the tubular roll;

FIG. 7 is an enlarged view taken on line 7—7 of FIG. 3 showing in cross-section a raised image area of the printing plate carrying a supply of ink thereon;

FIG. 8 is a view similar to FIG. 7 showing the ink after having been removed from the raised image area for printing a raised ink image on a substrate; and FIG. 9 is a greatly enlarged perspective view of a portion of a raised image area of the printing plate of this invention showing one of the part-spherical depressions therein.

Corresponding reference characters indicate corresponding parts throughout the several views of the drawings.

DESCRIPTION OF PREFERRED EMBODIMENTS

Figure 1:
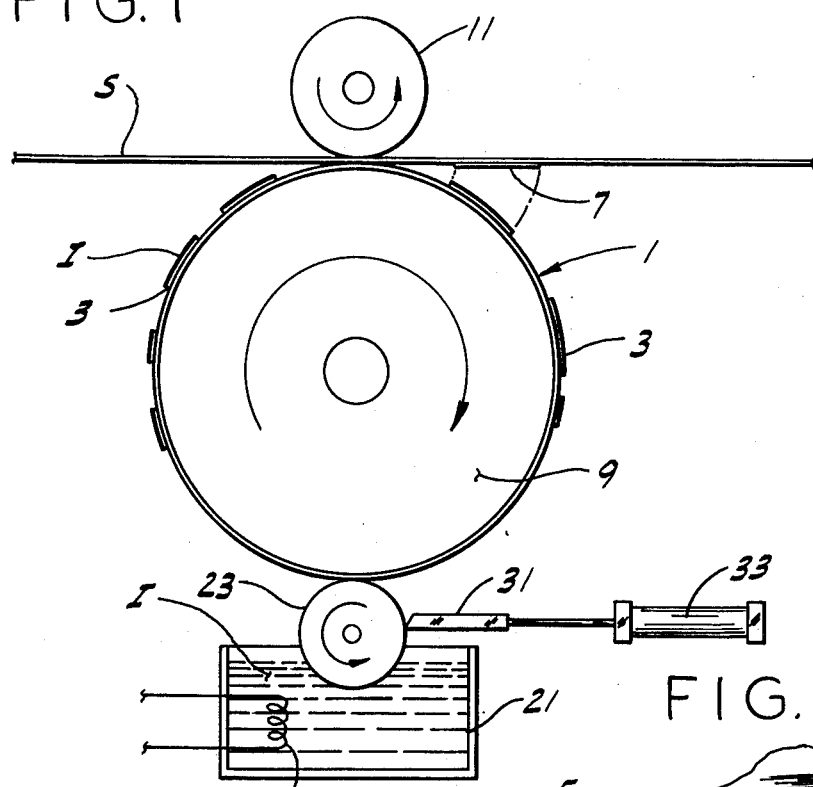
FIG. 1 is a diagramatic view of a portion of a rotary letter printing press illustrating the method of, and apparatus and printing plate of this invention for direct printing raised ink images, such as a raised ink hectographic master.
Figure 2:
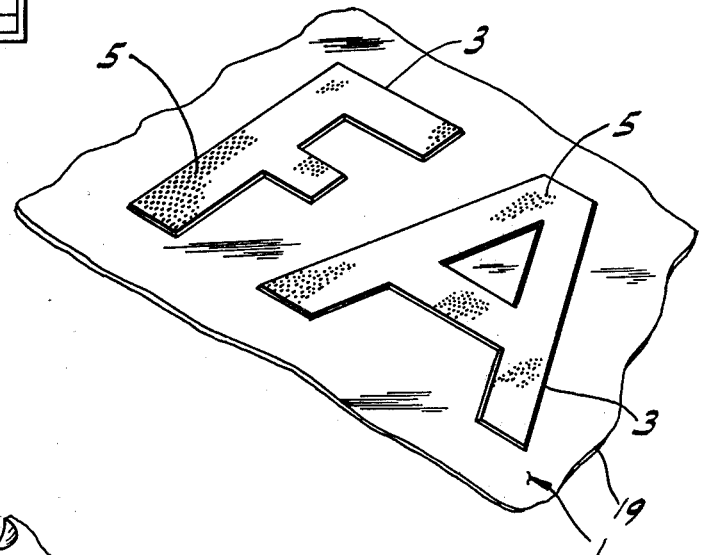
FIG. 2 is a perspective view of a portion of the printing plate of this invention showing ink-carrying raised or relief image areas thereon.

Referring now to the drawings, the method of this invention of direct printing identical raised ink images, such as raised ink hectographic masters, is best illustrated in FIG. 1. Simply stated, the method of this invention involves forming a relief image area printing plate 1, such as a raised letter or a relief photosensitive-type printing plate, in which the raised image or printing areas 3 thereon have a plurality of regularly spaced depressions or cells 5 therein for retaining an amount of ink I thereon sufficient to print raised ink images 7. The printing plate is then mounted on a support, such as on a plate roll 9 of a conventional rotary letter press modified in accordance with this invention, and then a metered supply of ink I is applied to the plate so that the ink fills depression 5 and entirely covers the planar surface of the raised image areas (see FIG. 7). A flexible substrate S (e.g., a suitable piece of paper or the like), which constitutes the substrate for the hectographic master or other item to be printed, is then brought into printing contact with the inked plate, as by running the substrate between the nip of the plate roll 9 and the impression roll 11 of the rotary letter press, for printing raised ink images 7 on the substrate. In printing hectographic masters, it is desirable that the ink images 7 be raised above the surface of substrate S a distance of about 0.0005–0.0007 inch so as to result in a hectographic master having an acceptable copy run life and being able to print legible copies.

The above-mentioned step of forming the raised image areas 3 on plate 1 is best illustrated in FIG. 4. A photographic image of the material to be printed, such as a photographic negative 13 of the material to be printed, and a pattern 15 of regularly and closely spaced opaque areas (also referred to as a multiplicity of other images) is photographically projected onto the light sensitive side 17 of the photosensitive printing plate 1 for a time sufficient to properly expose the plate in the well-known conventional manner. Pattern 15 is preferably included on a conventional printing screen 18 laid over negative 17 so that light 19 for exposing the plate is transmitted through both the screen and the negative whereby the pattern of opaque areas of the screen is photographically projected onto the exposed areas of the plate corresponding to the image areas 3 to be formed in relief thereon. Light 19 from a source, which may be a carbon arc lamp in a conventional plate making machine, is projected through the transparent areas of the negative and screen 18 to expose or photo-harden the light sensitive material. The plate is then developed in a conventional developing solution which dissolves the non-exposed light sensitive material thus leaving the raised relief image areas which have been photo-hardened. The resulting printing plate then will have direct reading raised or relief image areas 3 corresponding to the photographic image (i.e., corresponding to the transparent portion of negative 13) and a pattern of depressions 5 on the raised image areas corresponding to the screen-like pattern 15 of screen 18 projected onto the plate. It will be understood, however, that the screen-like images could be formed directly on the negative rather than being on a separate screen. It will also be understood that in FIG. 4 negative 17 and screen 18 are normally laid in face-to-face engagement with the printing plate and are pressed tightly thereagainst (as in a vacuum box) while exposing the plate so as to ensure proper exposure of the plate. FIG. 4 is shown exploded only for purposes of illustration.

Figure 3:
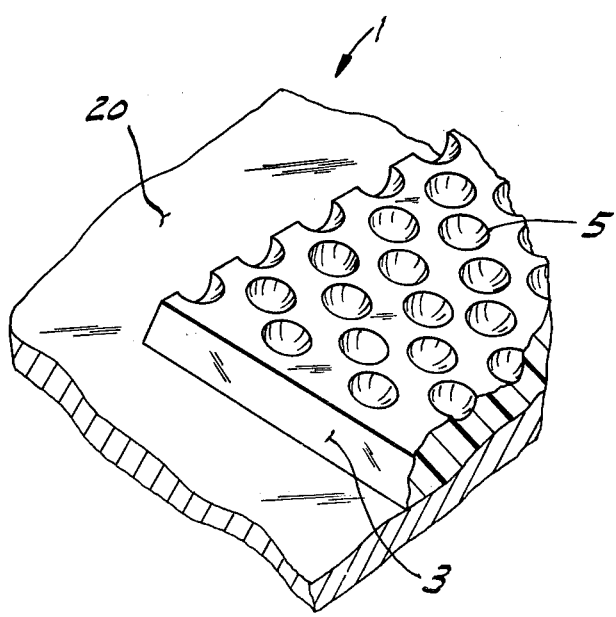
FIG. 3 is an enlarged perspective view of a portion of the printing plate of FIG. 2 more clearly illustrating a plurality of regularly spaced cell-like depressions formed in the raised image areas for enhancing the ink-carrying ability thereof.

In accordance with the method of this invention, plate 1 may be a commercially available raised image area photosensitive plate, such as commercially available from BASF Industries under their trade designation NYLO-PRINT. This plate has a ferro-metallic base plate 20 which is approximately 0.010 inch thick and has a photopolymer coating on one face thereof constituting its light sensitive side 17 about 0.015 inch thick. The exposure time and developing procedure of this plate is preferably in accordance with the instructions provided by its manufacturer. It will be understood, however, that printing plates other than the above-identified plate may be used to produce plate 1 in accordance with the method of this invention. After the plate has been developed, the raised image areas 3 thereon are raised above the surface of base plate 20 about 0.015 inch plus or minus 0.005 inch, as indicated at A in FIG. 3. The upper or planar surface of the raised image areas 3 is shown to be covered by an array of closely and regularly spaced depressions 5 arranged in the above-mentioned screen-like pattern. As shown in FIG. 9, each of these cell-like depressions is generally part-spherical in cross-section having a depth into the raised image area 3 of about 0.002–0.006 inch, and preferably about 0.004 inch. As shown in FIG. 3, depressions 5 in the raised image areas 3 may intersect the edges of the raised image area and it will be understood that this does not adversely affect the clarity or sharpness of the raised ink images 7 printed by the plate of this invention. Thus, there is no requirement of accurate placement or sizing of the screen-like pattern to the image areas.

As heretofore mentioned, depressions 5 are formed in plate 1 by projecting screen-like pattern 15 of opaque areas along with the photographic image of negative 13 onto the photosensitive coating 17 of plate 1 and then developing the plate in the conventional manner. Pattern 15 may be included on a conventional printing screen 18 having between about 90–180 lines to the inch, preferably about 100 lines to the inch, at a tone level ranging between about 40 to 60 percent. It will be understood that by substituting a positive working plate for the plate heretofore described, the plate may be exposed by photographically projecting a positive image on the material to be printed and screen-like pattern 15 onto the plate and then developing the plate. It will thus be understood that expression forming the plate by projecting a photographic image and screen-like pattern onto the plate is intended to include projecting either a negative or positive image and screen onto the plate, so as to form the raised image areas 3 with depressions 5 therein.

Further in accordance with the method of this invention of direct printing raised ink images 7, ink I, which is a liquid in one state and a solid in another and which has a relatively constant volume as it changed from a liquid to a solid, is applied to printing plate 1 as a liquid, is printed onto a substrate S as a liquid to form ink images 7, and then is rapidly, almost instantaneously, transformed from a liquid to a solid on the substrate substantially without changing its volume thereby to form a hard, raised ink image and to thus prevent smearing or smudging or shrinking of the raised ink image after it has been printed on the substrate. Preferably, ink I is a non-volatile hot-melt ink which melts upon being heated above its melting temperature and which solidifies upon being cooled below its freezing temperature and which contains solvent transferable dyes for use in hectographic duplicating. In printing raised ink image hectographic masters, any one of several hot-melt hectographic inks commercially available from Codo Manufacturing Corportion of Leetsdale, Pennsylvania, may be utilized. These inks are conventionally used in the production of impact or crash printed hectographic masters and hence a full description of the characteristics of these inks is not deemed necessary to the understanding of the disclosure of the present invention. In general, however, these inks do not exhibit a sharply defined melting temperature, but rather pass from a hard solid to a sticky paste, to a thick liquid, and then to a thinner liquid as the temperature of the ink is increased. For example, the ink may be hard solid at 155° F. (68° C.) and a flowable liquid at 170° F. (77° C.). These hectographic inks are thixotropic so that their viscosity is not only dependent on temperature, but also on the shear forces applied to it. For example, the viscosity of this ink at a temperature of 172° F. (78° C.), as measured with a Brookfield Rotational Viscometer, may be 200 centipoises at one speed and spindle combination and 9000 centipoises at another speed and spindle combination. As previously mentioned, ink I undergoes little or no change in volume as it changes from a liquid to a solid. In contrast, conventional solvent based hectographic printing inks often undergo a 40-50% reduction in volume as they dry or as the solvent therein is absorbed into the paper or evaporated. If one were to attempt to form raised ink images 7 on a substrate S having a desired thickness of about 0.0005–0.0007 inch, as is necessary for a hectographic master to have an acceptable copy run life, one would have to transfer a much greater quantity of ink to the substrate. This much greater quantity of ink required to form raised ink images with solvent-based ink can now only be done by expensive silk screen techniques. Also, if the ink were to undergo a significant volume change as it dried, the ink images formed thereby may be distorted and thus would not properly (i.e., clearly) print when used as a hectographic master.

As will be hereinafter more fully discussed, after the printing press has been operated for time sufficient to bring the temperature of printing plate 1 and plate roll 9 up to a normal equilibrium operating temperature, ink I will remain in its liquid state as it is transferred to the substrate and because the substrate and the impression roll 11 are substantially cooler than the elevated freezing temperature of the ink, the ink will freeze substantially instantaneously upon being applied to the substrate. It will be also noted that no additional chillers or driers or special equipment are required to effect the solidification (i.e., freezing) of the ink when it is applied to the substrate. While the above-described ink is preferably a hot-melt ink, it will be understood that other dual state inks, such as an ink that cures upon exposure to ultraviolet radiation or to an electron beam, may be printed onto the substrate as a liquid and then substantially instantaneously be transformed into a solid by exposing it to ultraviolet radiation or to an electron beam.

As shown in FIG. 1 ink I is transferred from an ink reservoir 21 to the inked portion (i.e., to relief image areas 3) of printing plate 1 by a rotatable ink transfer roll 23. In accordance with this invention, the ink-carrying surface of ink transfer roll 23 is formed to carry a sufficient quantity of ink to printing plate 1 so that the latter can readily form raised ink images 7 in the manner as heretofore described. More particularly, ink transfer roll 23 is preferably a hollow gravure cylinder including a steel base cylinder 25 (see FIG. 6) on which a layer 27 of copper is plated. A conventional gravure or light sensitive coating (not shown) is applied to the outer surface of the roll and a screen-like pattern is photographically projected onto the gravure coating on the roll so as to expose the gravure coating whereby upon developing the coating, a plurality of cell-like, part-spherical regularly spaced depressions 29 corresponding to the screen-like pattern is formed in the outer surface of the cylinder. These depressions are preferably arranged in the screen-like pattern having between about 70-180 lines per inch and more preferably having about 120-140 lines per inch and having a depth ranging from about 0.002-0.006 inch and even more preferably having a depth of about 0.004. After the depressions have been etched into the surface of the plate of ink roll 23, the entire outer surface of the roll may be chrome plated so as to provide a long-wearing surface.

The apparatus of this invention, which has been for the most part heretofore described in regard to the method of this invention, is generally a conventional rotary printing press such as a rotary letter press, which includes a doctor blade 31 engageable with ink transfer roll 23 thereby to insure that only a desired or metered amount of ink I is transferred by the ink transfer roll from the reservoir 21 to plate 1. This doctor blade is shown to be adjustable toward and away from the ink transfer roll by means of an air cylinder unit 33 in a manner well known in the art for varying the amount of ink transferred to the printing plate. As is shown in FIG. 1, ink transfer roll 23 is at least partially immersed in ink I contained within reservoir 21. The hot-melt ink is heated to a temperature above its melting temperature by a suitable heating means, such as an electrical resistance heater 35 immersed in the ink, or a heat exchanger (not shown) or the like. It will be appreciated that once the apparatus of this invention has been operated for a time sufficient to attain an equilibrium operating temperature, that ink transfer roll 23 (because it is partially immersed in the heated ink) will become heated to a temperature sufficient to prevent the ink from freezing as it is transferred to printing plate 1 and that the printing plate, as a result of contacting the heated transfer roll 23 and having hot ink applied thereto, will also attain a temperature sufficient to prevent the ink from freezing until it is printed on the relatively cold substrate S.

Further in accordance with this invention, ink transfer roll 23 may be optionally provided with a heater 37 (see FIG. 6) for heating the ink transfer roll so as to aid in maintaining the ink as a liquid as it is transferred from reservoir 21 to substrate S. Heater 37 is shown to be an electrical resistance heater, such as a tubular immersion heater, disposed axially within cylinder 25 of the ink transfer roll. The interior of this cylinder is shown to be filled (or at least partially filled) with a suitable heat transfer liquid 39, such as silicon fluid, to transfer heat from the heater 37 to the cylinder. It will be understood that power for energizing heater 37 may be supplied via slip rings (not shown) provided on journals 41 of the ink transfer roll. Heater 37 may also be a heat exchanger disposed within cylinder 25 having heated oil circulated therethrough. It has been found that such a heat exchange may be more readily controlled to heat the ink to a desired temperature.

The apparatus of this invention, as diagramatically depicted in FIG. 1, will be understood to include a suitable drive (not shown) for rotating plate roll 9 and the other normally driven components of a rotary letter press and for moving impression roll 11 on and off impression. For example, plate roll 9 may be operated at a surface speed of about 300 feet per minute to print raised ink hectographic masters at relatively high production rates. It will be understood that virtually any conventional rotary letter press could readily be modified to constitute the apparatus of this invention and to carry out the method of this invention by mounting printing plate 1 of this invention on its plate roll 9, by substituting ink roll 23 for the conventional ink transfer roll on the apparatus, and by modifying its ink reservoir to accommodate ink heater 35. A press modified in accordance with this invention can, of course, be readily converted for conventional rotary letter press printing merely by replacing plate 1, ink roll 23 and by removing heater 35.

It will be understood that depressions 5 in plate 1 serve to increase the amount of ink carried by the raised image or printing areas 3 of the plate and thus, in accordance with this invention, enable raised ink images 7 of a desired thickness to be printed on substrate S. More particularly, the depressions cooperate with the surface tension characteristics of liquid ink I to increase the thickness of the layer of ink I (see FIG. 7) carried by the raised image areas over the amount of ink that would have been carried by the same image areas had not the depressions 5 been present. It will also be understood that doctor blade 31 does not strike off all the ink above depressions 5, but rather controls the thickness of the liquid ink film carried by ink transfer roll 23 thereby indirectly metering the amount of ink applied to the raised image areas and controlling the thickness of the ink applied to substrate S. As can be seen in FIG. 8, some of the ink I will remain in depressions 5 after the printing plate image areas 3 have printingly engaged substrate S and printed raised ink images 7 thereon.

The method, apparatus and printing plate of this invention has been primarily described for printing raised ink hectographic masters, but it will be appreciated that this invention can readily be adapted to print pressure sensitive duplicating masters utilizing a pressure transferable ink rather than a spirit soluble ink and other raised ink images, such as are commonly used on stationery, invitations, greeting cards and paper decorations. These raised ink image printing jobs are now conventionally done by expensive engraving processes or by thermography. In thermography, special non-drying inks are used in conventional printing presses (e.g., offset) and the wet inks are dusted with a powdered compound. After the excess powder on the non-printed areas is vacuumed off the substrate, heat is applied to fuse the ink and the powder so as to cause the printing to swell or raise in relief and to thus produce an engraved effect. It will be appreciated that the same engraving effect can be achieved by directly printing raised ink images on the substrate in accordance with this invention thus eliminating the extra steps of dusting and curing the wet ink as are required in thermographic printing. Thus, raised ink image printing done in accordance with this invention not only eliminates the expensive engraving plates required for engraving and the extra steps required for thermographic printing, but the plates are conventional and the modifications required to a conventional press are minimal.

Of course, if direct reading printing images are required, the image areas 3 on plate 1 must be reverse-reading or a blanket roll must be interposed between plate roll 9 and substrate S. It may be desirable that the surface of this blanket roll be provided with ink-carrying depressions similar to the ink carrying surface of ink transfer roll 23 to enable a quantity of ink sufficient to print raised ink images on substrate S to be carried by the blanket roll. Thus, the term bringing the inked printing plate 1 of this invention into printing engagement with the substrate is herein defined to include offset as well as direct printing.

With the method of this invention, it is relatively easy to print direct reading copy on one side of substrate S (the front side of the hectographic master) in register with the reverse-reading raised ink images on the back side of the substrate by first printing the direct reading front copy on the substrate at a first printing station of the rotary letter press and then printing the hectographic ink image on the back side of the substrate in register with the front copy. In this manner direct reading front copy may be printed in line with the hectographic ink images.

As has been heretofore indicated that it is highly desirable that the raised ink images 7 printed on substrate S be raised above the surface of the substrate (i.e., have a thickness of) about 0.0005–0.0007 inch. It will be understood, however, that this is the preferred thickness of the ink images for direct printed raised ink hectographic masters because the resulting hectographic master will have a sufficiently long copy run life to produce an acceptable number of legible hectographic copies. It will be further understood that the thickness of the raised ink images 7 may be varied from this desired thickness and still be within the scope of this invention.

In view of the above, it will be seen that the several objects of the invention are achieved and other advantageous results attained.

As various changes could be made in the above constructions and method without departing from the scope of the invention, it is intended that all matter contained in the above description or shown in the accompanying drawings shall be interpreted as illustrative and not in a limiting sense.

What is claimed is:

1. The method of printing a raised ink hectographic master, utilizing a printing plate having a photosensitive coating which has a generally plane surface, said method comprising:

A. photographically exposing the coating on the plate to
    (1) an image of material to be printed, and also
    (2) an image of a screen for forming a pattern of ink cells in intaglio in the coating, the exposure rendering removable those portions of the coating around areas of the coating corresponding to the areas of the material to be printed, and also rendering removable those portions of the coating within said areas corresponding to said pattern of ink cells while enabling retention of the said areas of the coating as raised printing areas on the plate;
    B. processing the exposed plate to remove said removable portions of the coating, including the ink cell portions, thereby forming said raised printing areas in relief on the plate with each of said areas having a generally plane surface constituted by a portion of the original plane surface of the coating and with a multiplicity of ink cells in intaglio in each said area corresponding to said pattern;
    C. applying a non-volatile solvent transferable hectographic ink to said raised printing areas in sufficient amount not only to fill said ink cells but also to cover the said surfaces of said raised printing areas; and
    D. bringing the inked plate and a master substrate into engagement with one another for transfer not only of the hectographic ink on the said surfaces of the raised printing areas but also for transfer of at least some of the hectographic ink in the ink cells to the substrate, thereby to form raised hectographic ink images on the substrate.

2. The method of claim 1 wherein the hectographic ink is applied to said raised printing areas in such thickness on the surfaces of the raised printing areas as well as in the ink cells as to effect transfer of the ink to the substrate in amount such that the raised hectographic images are printed at least 0.0004 inch thick on the substrate.

3. The method of claim 2 wherein the hectographic ink is transferred in a liquid state to the printing plate by an ink transfer roll and thence to the substrate, the ink transfer roll having a pattern of ink cells therein, the ink being applied in a liquid state to the ink transfer roll in such amount as to cause transfer of ink to the raised printing areas of the printing plate in sufficient amount not only to fill the ink cells in said plate but also to cover the said surfaces of said areas and transfer of ink from the plate to the substrate in amount to print the raised hectographic images at least 0.0004 inch thick on the substrate, and effecting rapid change of the ink from a liquid to a solid on the substrate.

4. The method of claim 3 wherein the ink is a hot-melt ink, and wherein the ink is maintained melted in a reservoir and transferred to the transfer roll from the reservoir.

5. The method of claim 4 wherein the transfer roll is heated to aid in maintaining said ink as a liquid on the transfer roll.

6. Apparatus for printing a raised ink hectographic master comprising:
a frame;
a cylindric roll journalled in the frame for rotation about its axis, said cylindric roll supporting a printing plate for printing engagement with a hectographic master substrate, said printing plate having raised printing areas in relief thereon raised above non-printing portions of the plate, each said raised printing area having a multiplicity of ink cells in intaglio therein for holding a supply of ink sufficient to print raised hectographic ink images on said substrate;
an ink reservoir adapted to hold a supply of hot-melt hectographic ink which when heated above a first temperature constituting its melting temperature is a liquid and which when cooled below a second temperature constituting its freezing temperature is a solid;
means for bringing said substrate and said printing plate mounted on said cyclindric roll into printing engagement with one another thereby to transfer an ink image from said printing plate onto said substrate;
means for heating the ink in said reservoir above said melting temperature of said ink and for maintaining said ink as a liquid as the ink is transferred from said reservoir to said substrate at which time it substantially instantaneously freezes thereby to form a raised ink image on said substrate;
an ink transfer roll for transferring ink from said reservoir to said plate, said transfer roll being at least partially immersed in said melted ink in said reservoir and thereby being heated to a temperature sufficient for maintaining said ink as a liquid as the ink is transferred to the plate and the substrate;
said transfer roll having a pattern of ink cells in intaglio in its surface.

7. Apparatus as set forth in claim 6 comprising means for heating said ink transfer roll so as to maintain said ink as a liquid as it is transferred from said reservoir and is printed on said substrate.

8. Apparatus as set forth in claim 6 further comprising a doctor blade cooperable with said ink transfer roll to meter the amount of ink applied to said printing plate.

9. Apparatus as set forth in claim 6 wherein said surface ink cells in the transfer roll are arranged in a screen-like pattern ranging between about 70–180 lines per inch and ranging in depth between about 0.002 and 0.006 inch.

10. Apparatus as set forth in claim 9 wherein said screen-like pattern preferably ranges between about 120–140 lines per inch, and wherein the depth of said depressions is preferably about 0.004 inch.

11. Apparatus as set forth in claim 9 wherein the ink cells in the printing plate are in a screen-like pattern ranging between about 90–180 lines per inch and ranging in depth between about 0.002–0.006 inch.

* * * * *